United States Patent
Kim

(10) Patent No.: US 9,647,017 B2
(45) Date of Patent: May 9, 2017

(54) CURVED IMAGE SENSOR AND ELECTRONIC DEVICE HAVING THE SAME

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/670,056

(22) Filed: Mar. 26, 2015

(65) Prior Publication Data

US 2016/0172393 A1 Jun. 16, 2016

(30) Foreign Application Priority Data

Dec. 15, 2014 (KR) ........................ 10-2014-0180216

(51) Int. Cl.
*H04N 5/335* (2011.01)
*H01L 27/146* (2006.01)

(52) U.S. Cl.
CPC .. *H01L 27/14603* (2013.01); *H01L 27/14636* (2013.01); *H01L 27/14685* (2013.01); *H01L 27/14687* (2013.01)

(58) Field of Classification Search
CPC ................................................ H01L 27/14603
See application file for complete search history.

(56) References Cited

U.S. PATENT DOCUMENTS

| | | | | |
|---|---|---|---|---|
| 6,285,400 B1* | 9/2001 | Hokari | ................... | H04N 5/217 250/239 |
| 7,626,621 B2* | 12/2009 | Ito | ........................ | H04N 5/2253 348/294 |
| 2006/0038183 A1* | 2/2006 | Oliver | ............... | H01L 27/14618 257/79 |
| 2006/0275941 A1 | 12/2006 | Oliver et al. | | |
| 2009/0115875 A1* | 5/2009 | Choi | .................. | H01L 27/14618 348/294 |
| 2012/0147207 A1* | 6/2012 | Itonaga | ............. | H01L 27/14618 348/222.1 |
| 2014/0160327 A1* | 6/2014 | Enoki | ................... | H01L 27/307 348/294 |

* cited by examiner

*Primary Examiner* — Gary C Vieaux
(74) *Attorney, Agent, or Firm* — IP & T Group LLP

(57) ABSTRACT

A curved image sensor includes a supporting substrate, a bonding pattern provided over the supporting substrate a sensing substrate provided over the supporting substrate and in contact with the bonding pattern, and having a curved surface receiving incident light, and a fixing pattern provided over the supporting substrate and surrounding a periphery of the sensing substrate.

12 Claims, 7 Drawing Sheets

CURVED IMAGE SENSOR AND ELECTRONIC DEVICE HAVING THE SAME

CROSS-REFERENCE TO RELATED APPLICATIONS

The present document claims priority of Korean Patent Application No. 10-2014-0180216, entitled "CURVED IMAGE SENSOR, METHOD FOR FABRICATING THE SAME AND ELECTRONIC DEVICE HAVING THE SAME" and filed on Dec. 15, 2014, which is incorporated herein by reference in its entirety.

BACKGROUND

Exemplary embodiments of the present invention relate to a semiconductor device and, more specifically, to a curved image sensor.

An image capturing device, e.g., a camera, includes an image sensor and a lens. The lens is provided over a light receiving surface. When an image of an object is formed, there is lack of focus between the center and periphery of the image due to chromatic aberrations of the lens, a phenomena referred to as field curvature. Thus, field curvature correction (or lens aberration correction) is necessary.

To address this issue, a curved image sensor has been suggested. In the curved image sensor, a light receiving surface is curved to correspond to the curvature of the lens. Photoelectric conversion elements are arranged on the curved surface, i.e., the light receiving surface, with the goal of improving image quality.

SUMMARY

Various embodiments are directed to an image sensor with high productivity, a method for fabricating the same, and an electronic device including the same.

A curved image sensor according to an embodiment of the present invention includes a supporting substrate, a bonding pattern provided over the supporting substrate, a sensing substrate provided over the supporting substrate and in contact with the bonding pattern, and having a curved surface receiving incident light, and a fixing pattern provided over the supporting substrate and surrounding the periphery of the sensing substrate. The curved image sensor may further include a closed air cavity enclosed by the sensing substrate, the supporting substrate, and the fixing pattern. The closed air cavity may have a lower pressure than the outside of the curved image sensor.

The sensing substrate may include a device wafer. The supporting substrate may include a carrier wafer. The bonding pattern may be in contact with a center of the sensing substrate. The area of the bonding pattern may be 10-20% of the area of the sensing substrate. A width-length ratio of the bonding pattern may be approximately the same as a width-length ratio of the sensing substrate. The fixing pattern may be in contact with a sidewall of the sensing substrate. The sensing substrate may have an inclined sidewall. The fixing pattern may have a donut shape. The fixing pattern may include thermosetting material.

The curved image sensor may further include a logic circuit layer provided over the supporting substrate and in contact with the bonding pattern and the fixing pattern, and a plurality of connectors passing through the fixing pattern and suitable for electrically connecting the sensing substrate to the logic circuit layer.

A method for fabricating a curved image sensor according to an embodiment includes providing a device wafer including a plurality of die regions and a scribe lane, forming a bonding pattern over each of the die regions, bonding a carrier wafer to the device wafer to be in contact with the bonding pattern, selectively etching the device wafer corresponding to the scribe lane to form a trench, wherein the trench divides the die regions from each other, filling the trench to form a fixing layer, wherein the fixing layer extends under the trench to form a closed air cavity enclosed by the fixing layer, the carrier wafer and each of the die regions, sawing the scribe lane to separate the die regions into a plurality of dies, and curving an upper surface of each of the dies and forming a fixing pattern supporting the curved surface.

The bonding pattern may be located in a center of each of the die regions. The area of the bonding pattern may be 10-20% of the area of each of the die regions. A width-length ratio of the bonding pattern may be approximately the same as a width-length ratio of each of die regions. The method may further include forming a sacrificial layer over the device wafer before the bonding of the carrier wafer to the device wafer and removing the sacrificial layer before the forming of the fixing layer. The sacrificial layer may have a surface flush with a surface of the bonding pattern. The trench may have an inclined sidewall. The curving of the upper surface of each of the dies and the forming of the fixing pattern supporting the curved surface may include expanding air in the closed air cavity and transforming the shape of the fixing layer through a set annealing temperature. The expanding and the transforming may be performed simultaneously. The fixing layer may include an elastic polymer. The elastic polymer may be a thermosetting polymer.

An electronic device according to an embodiment may include an optical system, a curved image sensor suitable for receiving light from the optical system, and a signal processing element suitable for processing a signal outputted from the curved image sensor. The curved image sensor may include a supporting substrate, a bonding pattern provided over the supporting substrate, a sensing substrate provided over the supporting substrate and in contact with the bonding pattern, and having a curved surface receiving incident light, and a fixing pattern provided over the supporting substrate and surrounding a periphery of the sensing substrate. The electronic device may further include a logic circuit layer provided over the supporting substrate and in contact with the bonding pattern and the fixing pattern; and a plurality of connectors passing through the fixing pattern and suitable for electrically connecting the sensing substrate and the logic circuit layer.

A curved image sensor includes a bonding pattern and a fixing pattern to form a curved sensing substrate which incident light hits. This structure may improve productivity of the curved image sensor significantly. Also, it is possible to miniaturize a package including the curved image sensor.

In addition, the curved image sensor employs a logic circuit layer and a connector to improve the integration degree thereof. Thus, a device including the curved image sensor may be small in size and its operation speed may be improved.

In addition, the curved image sensor is formed at a wafer level before packaging. Therefore, productivity of the curved image sensor improves and the size (especially, height/thickness) of the package including the curved image sensor may be reduced.

DETAILED DESCRIPTION

Figure 1:
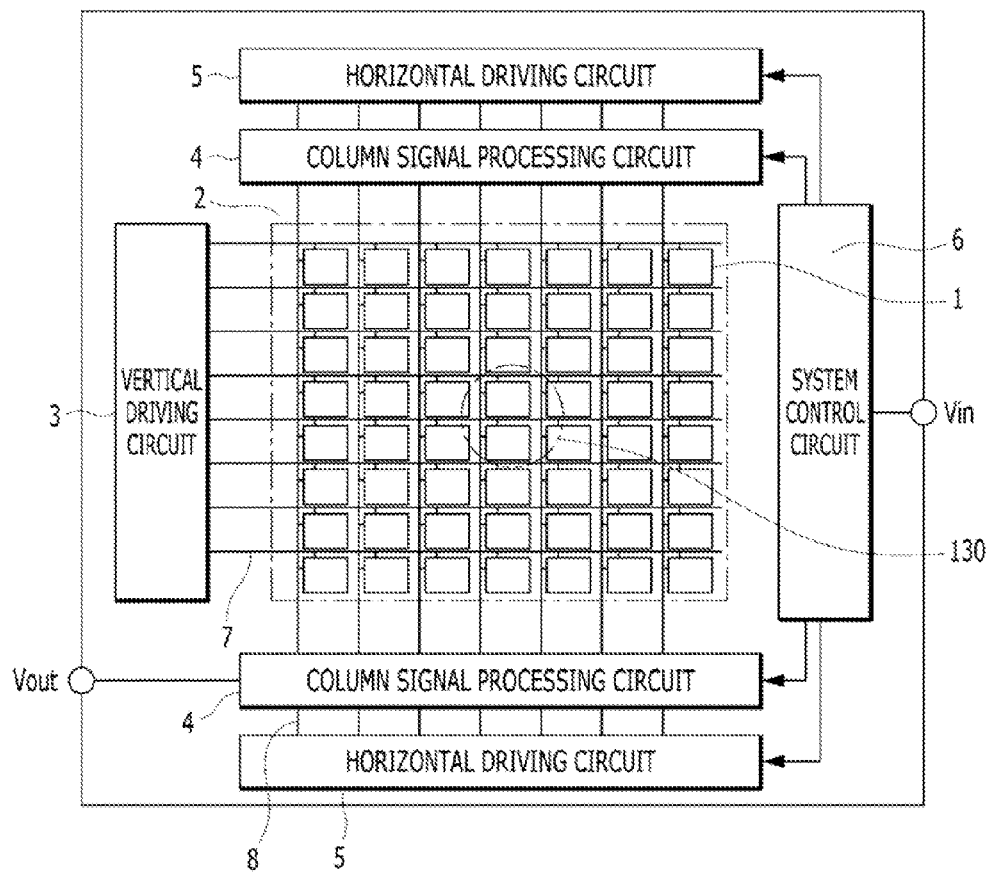
FIG. 1 shows a curved image sensor according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Embodiments according to the present invention provide a curved image sensor with high productivity, a method for fabricating the same, and an electric device including the same. A conventional curved image sensor is made by three-dimensionally bending its surface so that the surface has substantially the same curvature as a curved surface of a lens. A plurality of photoelectric conversion elements are provided over the curved surface of the image sensor (i.e. the surface receiving light). The curved surface according to conventional art is formed during the packaging process, when the individual chips are packaged. Thus, productivity of the image sensor is significantly reduced and it is difficult to reduce the size of the image sensor.

An image sensor is a semiconductor device that converts an optical image into an electrical signal. Image sensors are typically classified into CCD (Charge Coupled Device) image sensors and CMOS (Complementary Metal Oxide Semiconductor) image sensors.

Compared with a CCD image sensor, a CMOS image sensor is advantageous in that its driving mechanism is relatively simple and various scanning methods may be employed. In addition, circuits, e.g., circuits for processing signals transferred from pixels, may be integrated into a single chip using a CMOS process. Thus, the device size may be reduced, and production cost may be saved, and power consumption may be lowered. Due to these advantages, CMOS Image sensors have been extensively studied and various CMOS image sensors have been developed. The CMOS image sensor may be further classified into front-side illumination type devices and back-side illumination type devices.

The back-side illumination type device is known for having superior operation characteristics (e.g., sensitivity) relative to the front-side illumination type device. Thus, in the following description, a back-side illumination type CMOS image sensor will be exemplified as an embodiment.

FIG. 1 shows a curved image sensor according to an embodiment of the present invention. Specifically, FIG. 1 is a plan view briefly showing a structure of a curved image sensor which is an embodiment of the present invention.

As shown in FIG. 1, the image sensor according to an embodiment of the present invention may include a pixel array 2. In the pixel array 2, pixels are two-dimensionally arranged and photoelectric conversion elements are included. Each pixel 1 of the pixel array 2 is coupled to the photoelectric conversion elements and a pixel circuit (not shown). The pixel circuit includes a plurality of transistors and capacitors. The plurality of photoelectric conversion elements may share a part of the pixel circuit. The pixel circuit may be provided on the same side as the photoelectric conversion elements (e.g., the side receiving incident light) or may be provided on the opposite side of the photoelectric conversion elements (e.g., opposite to the side receiving incident light).

As will be described below, in a curved image sensor according to an embodiment of the present invention, a fixing pattern may have a donut shape surrounding the periphery of the pixel array 2. A bonding pattern may be disposed in the center of the pixel array 2. In a peripheral area of the pixel array 2, a peripheral circuit, e.g., a vertical driving circuit 3, a column signal processing circuit 4, a horizontal driving circuit 5, a system control circuit 6, etc., may be provided.

Figure 2A:
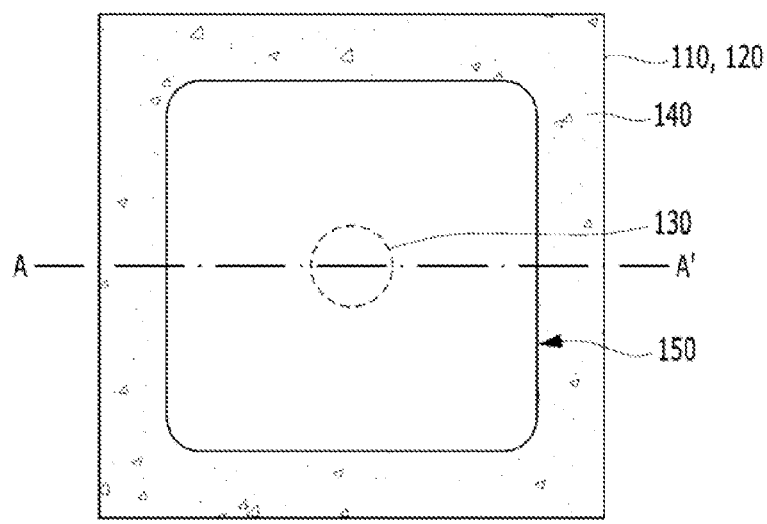
FIGS. 2A and 2B show a curved image sensor according to a first embodiment of the present invention.
Figure 2B:
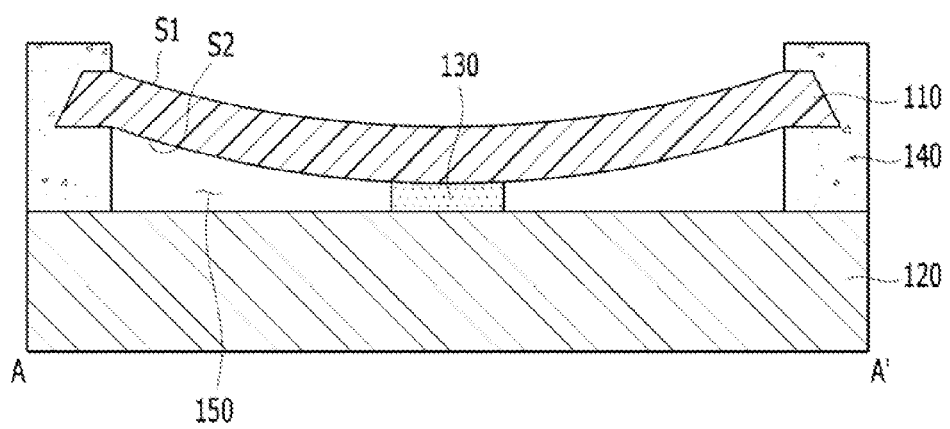

The peripheral circuit and the pixel array 2 may be provided on the same substrate (See FIGS. 2A and 2B). In another embodiment, the peripheral circuit and the pixel array 2 may be provided on different substrates. In the latter case, a member, e.g., a connector, for electrically connecting the pixel array 2 to the peripheral circuit may be provided on the bonding pattern and/or the fixing pattern (See FIGS. 3A and 3B).

The vertical driving circuit 3 may be a shift register. The vertical driving circuit 3 may select a pixel driving line 7 wired up to the pixel array 2, provide a pulse signal to the selected pixel driving line 7, and drive the pixels connected to the selected pixel driving line 7 and arranged in the pixel array 2 on a row basis. The vertical driving circuit 3 may sequentially select and drive each row of the pixels in the pixel array 2 as a basic unit. Pixel signals, which are generated in respective pixels in response to intensity of incident light, are provided to the column signal processing circuit 4.

The column signal processing circuit 4 is provided in every single column of the pixel array 2. The column signal processing circuit 4 processes, on a column basis, signals outputted from the pixels coupled to the same column to eliminate noise from the signals. That is, the column signal processing circuit 4 may perform, e.g., Correlated Double Sampling (CDS), signal amplification, Analog Digital Conversion (ADC), etc.

The horizontal driving circuit 5 may be a shift register. Horizontal pulses are sequentially provided to sequentially select respective column signal processing circuits 4. As a result, pixel signals are outputted from the respective column signal processing circuits 4. An output circuit processes the signals provided from the respective column signal processing circuits 4 and outputs the processed signals. The processing by the output circuit may include, for example, buffering, either alone or in combination with, dark level adjustment, row deviation adjustment, various types of digital signal processing, etc.

The system control circuit 6 may receive data signifying input clocks, operation modes, etc., and outputs internal information of the image sensor. For example, the system control circuit 6 may generate a clock signal or a control signal in response to a vertical synchronization signal, a horizontal synchronization signal, and a master clock. The clock signal and the control signal are reference signals for operation of the vertical driving circuit 3, the column signal processing circuit 4, and the horizontal driving circuit 5. The generated clock signal and control signal are provided to the vertical driving circuit 3, the column signal processing circuit 4, and the horizontal driving circuit 5.

FIGS. 2A and 2B show a curved image sensor according to a first embodiment of the present invention. Specifically, FIG. 2A is a plan view and FIG. 2B is a cross-sectional view taken along the line A-A' in FIG. 2A.

As shown in FIGS. 2A and 2B, a curved image sensor according to the first embodiment may include a supporting substrate 120, a bonding pattern 130 provided over the supporting substrate 120, a sensing substrate 110 provided over the supporting substrate 120 and in contact with the bonding pattern 130, which includes a plurality of photoelectric conversion elements (not shown) and has a curved surface S1 receiving incident light, and a fixing pattern 140 provided over the supporting substrate and surrounding a periphery of the sensing substrate 110.

An air cavity is enclosed by the supporting substrate 120, the sensing substrate 110, and the fixing pattern 140. The air cavity may be a closed air cavity 150 and blocked from external air. The closed air cavity 150 may have a pressure lower than outside (or room pressure).

The sensing substrate 110 may be a device wafer. The supporting substrate 120 may be a carrier wafer or a handle wafer. For example, the sensing substrate 110 may be a part of a device wafer on which a plurality of image sensors is formed. The supporting substrate 120 may be a part of a carrier wafer. The sensing substrate 110 and the supporting substrate 120 may be formed thin by a thinning process. The supporting substrate 120, in addition to the bonding pattern 130 and the fixing pattern 140, may support the sensing substrate 110 with a curved light receiving surface S1. The sensing substrate (110), the supporting substrate 120, or both may include a semiconductor substrate. The semiconductor substrate may be a single crystal material and may include silicon-containing material. That is, the sensing substrate 110, the supporting substrate 120, or both may include a monocrystalline silicon-containing material. For example, either the sensing substrate 110 or the supporting substrate 120 may be a bulk silicon substrate.

When the image sensor according to the first embodiment is a back-side illumination type CMOS image sensor, the curved light receiving surface S1 of the sensing substrate 110 may constitute a backside of the sensing substrate 110. The opposite side S2 to the curved light receiving surface S1 may be a front side of the sensing substrate 110. Even though not shown in drawings, the curved image sensor according to an embodiment may further include an interlayer insulating layer. The interlayer insulating layer (not shown) may be formed on the front side of the sensing substrate 110, i.e., the opposite side S2, and includes a signal generating circuit. The interlayer insulating layer (not shown) may include an oxide layer, a nitride layer, an oxynitride layer, or a stack layer thereof.

The signal generating circuit formed inside the Interlayer insulating layer (not shown) may include a plurality of transistors, a multi-layered metal line, a plurality of capacitors, and a plurality of contact plugs. The plurality of contact plugs connects the plurality of transistors, the multi-layered metal line, and the plurality of capacitors to each other. The signal generating circuit may include the pixel circuit and the peripheral circuits described with respect to FIG. 1.

The curved image sensor according to an embodiment may further include color filters (not shown) formed on the backside of the sensing substrate 110, i.e., the curved light receiving surface S1, and micro lenses (not shown) formed on the color filters. The color filters (not shown) are arranged to correspond to the respective photoelectric conversion elements.

The photoelectric conversion elements formed on the sensing substrate 110 may include photodiodes. For example, the photoelectric conversion elements may include one or more photoelectric conversion parts which are vertically stacked on the sensing substrate 110. Each of the photoelectric conversion parts may include a P-type impurity region and an N-type impurity region. In addition, the photoelectric conversion elements may include organic photoelectric conversion elements formed on the sensing substrate 110.

The bonding pattern 130 on the supporting substrate 120 may serve as an adhesive member for bonding the sensing substrate 110 (including a device wafer) and the supporting substrate 120 (including a carrier wafer). The bonding pattern 130 may be in contact with the opposite side S2 of the sensing substrate 110. The bonding pattern 130 may include an insulating material. Specifically, the bonding pattern 130 may include one or more of oxide material, nitride material, and oxynitride material. For example, when the sensing substrate 110 and the supporting substrate 120 include silicon-containing material, the bonding pattern 130 may include silicon oxide or silicon nitride. In addition, the bonding pattern 130 may contribute to forming of the curved light receiving surface S1 of the sensing substrate 110.

As will be described below, the bonding pattern 130 may hold the sensing substrate 110 while air within the closed air cavity 150 expands to make the light receiving surface S1 curved. Thus, the bonding pattern 130 may be in contact with the center of the sensing substrate 110 so that a curved light receiving surface S1 may have a given curvature. Specifically, the bonding pattern 130 may be in contact with the center of the pixel array formed on the sensing substrate 110. The bonding pattern may be in a quadrangle shape, in a polygon shape, or in a circle shape when viewed from the top.

The width-length ratio (or, aspect ratio) of the bonding pattern 130 may be the same as the width-length ratio of the sensing substrate 110. To provide sufficient bonding between the supporting substrate 120 and the sensing substrate 110, the size (or area) of the bonding pattern 130 or the contact area between the bonding pattern 130 and the sensing substrate 110 may be 10-20% of the size (or area) of the sensing substrate 110. When the size of the bonding pattern is less than 10%, it is difficult to provide sufficient adhesion. When the size of the bonding pattern is more than 20%, the curved light receiving surface S1 may be uneven or non-uniform and may not have constant curvature, deteriorating the performance of the image sensor.

The fixing pattern 140 may contribute, in addition to the bonding pattern 130, to bonding of the supporting substrate 120 and the sensing substrate 110. The fixing pattern 140 may contribute, in addition to the supporting substrate 120 and the sensing substrate 110, to forming of the closed air cavity 150. For this purpose, the fixing pattern 140 may have a donut shape. The fixing pattern 140 may include thermosetting material.

The fixing pattern 140 may keep the light receiving surface S1 of the sensing substrate 110 curved. The fixing pattern 140 may surround the periphery of the sensing substrate 140 and may be thicker (or higher) than the bonding pattern 130. Specifically, the fixing pattern 140 may be in contact with a sidewall of the sensing substrate 110. More specifically, the fixing pattern 140 may be in contact with a front side of the periphery of the sensing substrate 110, a back side of the periphery of the sensing substrate 110, and a sidewall of the periphery of the sensing substrate 110. That is, the periphery of the sensing substrate 110 may extend into and may be buried in the fixing pattern 140. In order to increase the contact area between the fixing pattern 140 and the sensing substrate 110 and to ensure bonding between the fixing pattern 140 and the sensing substrate 110, the sensing substrate 110 may have an inclined sidewall.

The curved image sensor according to the first embodiment uses the bonding pattern 130 and the fixing pattern 140 to provide the curved light receiving surface S1 of the sensing substrate 110, thereby improving its productivity significantly. In addition, the curved image sensor may be included in a reduced sized package. These advantages may be more apparent after viewing the illustrations of a method for fabricating the curved image sensor (See FIGS. 4A through 4F).

Figure 3A:
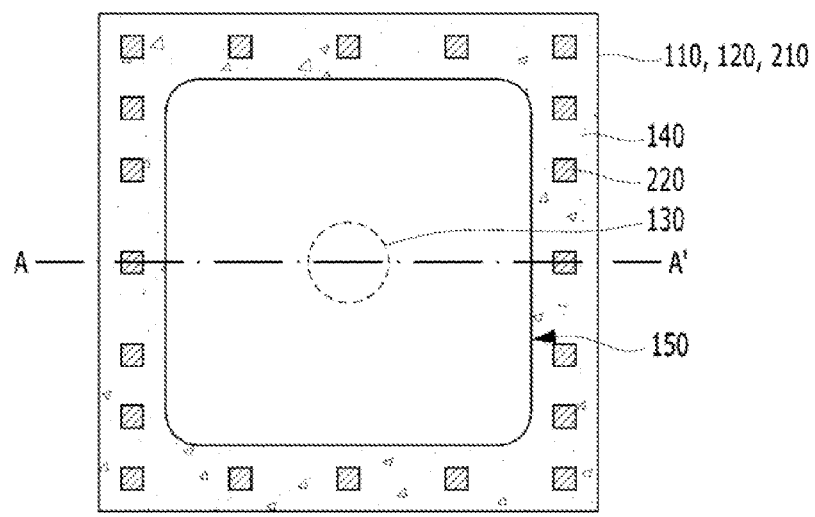
FIGS. 3A and 3B show a curved image sensor according to a first embodiment of the present invention.
Figure 3B:
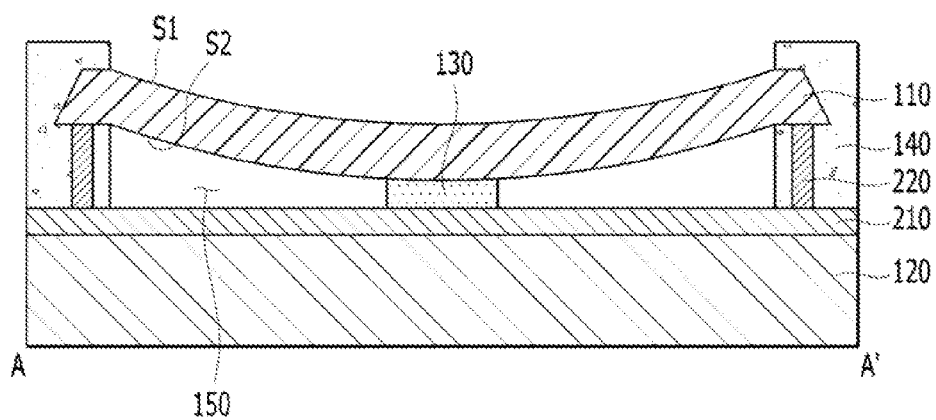

FIGS. 3A and 3B show a curved image sensor according to a second embodiment. Specifically, FIG. 3A is a plan view and FIG. 3B is a cross-sectional view taken along the line A-A' shown in FIG. 3A. The same reference numerals are used in both of the first embodiment and the second embodiment to denote the same or like members. For simplicity and conciseness, explanations on elements already described with respect to the first embodiment will be omitted.

As shown in FIGS. 3A and 3B, a curved image sensor according to a second embodiment may include a supporting substrate 120, a logic circuit layer 210 provided over the supporting substrate 120, a bonding pattern 130 provided over the logic circuit layer 210, a sensing substrate 110 provided over the supporting substrate 120 in contact with the bonding pattern 130, and having a curved surface S1 which receives incident light, a fixing pattern 140 provided over the logic circuit layer 210 and surrounding a periphery of the sensing substrate 110, and a plurality of connectors 220 passing through the fixing pattern 140 and electrically connecting the sensing substrate 110 and the logic circuit layer 210.

A cavity formed by the supporting substrate 120, the sensing substrate 110, and the fixing pattern 140 may be a closed air cavity 150. External air is blocked from flowing into the closed air cavity 150. When the image sensor according to this embodiment is a back-side illumination type image sensor, the curved light receiving surface S1 of the sensing substrate 110 may constitute the backside of the sensing substrate 110 and the opposite side S2 of the light receiving surface S1 may constitute the front side of the sensing substrate 110.

Even though not shown in drawings, the curved image sensor according to this embodiment may further include an interlayer insulating layer formed on the front side of the sensing substrate 110, i.e., the opposite side S2. The interlayer insulating layer may include a signal generating circuit. The interlayer insulating layer may be an oxide layer, a nitride layer, an oxynitride layer, or a stack layer thereof.

The signal generating circuit formed in the interlayer insulating layer may include a plurality of transistors, a multi-layered metal line, a plurality of capacitors, and a plurality of contact plugs. The plurality of contact plugs connects the plurality of transistors, the multi-layered metal line, and the plurality of capacitors to each other.

The signal generating circuit may include the pixel circuit and the peripheral circuits described above with respect to FIG. 1. The curved image sensor may further include color filters (not shown) and micro lenses (not shown) formed on the color filters. The color filters are formed on the back side of the sensing substrate 110, i.e., the curved light receiving surface S1, and are arranged to correspond to the respective photoelectric conversion elements.

The logic circuit layer 210, formed on the supporting substrate 120, may further include the peripheral circuit described above with respect to FIG. 1 or an image processing circuit including Image Signal Processing (ISP). Similar to the interlayer insulating layer, the logic circuit layer 210 may include a plurality of transistors, a multi-layered metal line, a plurality of capacitors, a plurality of contact plugs and a pad connected to the connector 220. The plurality of contact plugs connects the plurality of transistors, the multi-layered metal line, and the plurality of capacitors to each other.

In the second embodiment, the plurality of connectors 220 is formed in the fixing pattern 140. However, in another embodiment, the plurality of connectors 220 may be formed in the bonding pattern 130 as well, in addition to the fixing pattern 140.

The curved image sensor according to the second embodiment uses the bonding pattern 130 and the fixing pattern 140 to provide the curved light receiving surface S1 of the sensing substrate 110, thus improving its productivity significantly. In addition, the curved image sensor may be formed in a smaller size. These advantages will be more apparent from the following description of a method for fabricating the curved image sensor according to an embodiment (See FIGS. 4A through 4F). The curved image sensor also includes the logic circuit layer 210 and the connector 220 to increase integration, reduce size, and improve operation speed.

FIGS. 4A to 4F are perspective views illustrating a method for fabricating a curved image sensor according to an embodiment of the present invention. Hereinafter, a method for fabricating the curved image sensor according to the first embodiment will be described. The perspective views of FIGS. 4A to 4F show the cross-sections taken along the line A-A' in FIG. 2A.

Figure 4A:
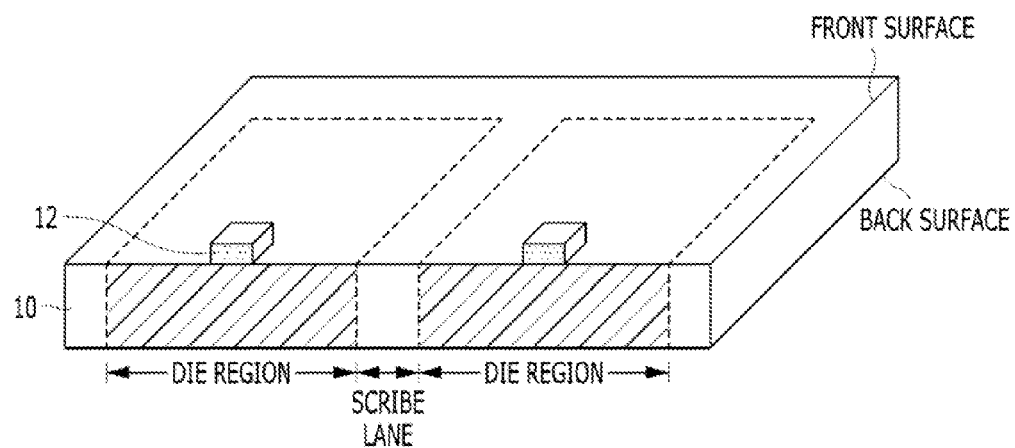
FIGS. 4A to 4F show a method for fabricating a curved image sensor according to an embodiment of the present invention.

As shown in FIG. 4A, a device wafer 10 with a plurality of die regions and a scribe lane is prepared. The device wafer 10 may be a single crystal material and may include silicon-containing material. For example, the device wafer 10 may be a bulk silicon wafer.

Next, an image sensor (not shown) including a plurality of photoelectric conversion elements (not shown) is formed on each of the die regions. For example, even though not shown in drawings, a plurality of photoelectric conversion elements is formed on the device wafer 10. An interlayer insulating layer including signal generating circuits may be formed on the device wafer 10.

Next, a bonding pattern 12 is formed on each of the die regions. The bonding pattern 12 may improve the bonding strength between the two wafers. The bonding pattern 12 forms a cavity between the two wafers. The bonding pattern 12 contributes to forming of the curved light receiving surface. The bonding pattern 12 may include insulating material. Specifically, the bonding pattern 12 may include oxide, nitride, oxynitride, or a combination thereof. For example, the bonding pattern 12 may be formed of silicon nitride.

The bonding pattern 12 may be formed by forming an insulating layer on the device wafer 10 and selectively etching the insulating layer. The bonding pattern 12 may be formed on the front side of the device wafer 10 and be located on the center of the die region. Specifically, the bonding pattern 12 may be formed on the center of the pixel array where a plurality of pixels is arranged two-dimensionally in the die region. The size of the bonding pattern 12 or the contact area between the bonding pattern 12 and the die region may be 10-20% of the area of the die region.

The bonding pattern 12 may be a quadrangle, a polygon, or a circle in shape when viewed from the top. The width-length ratio (aspect ratio) of the bonding pattern 12 may be the same as the width-length ratio (aspect ratio) of the die region. This is to form the curved light receiving surface with a uniform curvature in a subsequent process.

Figure 4B:
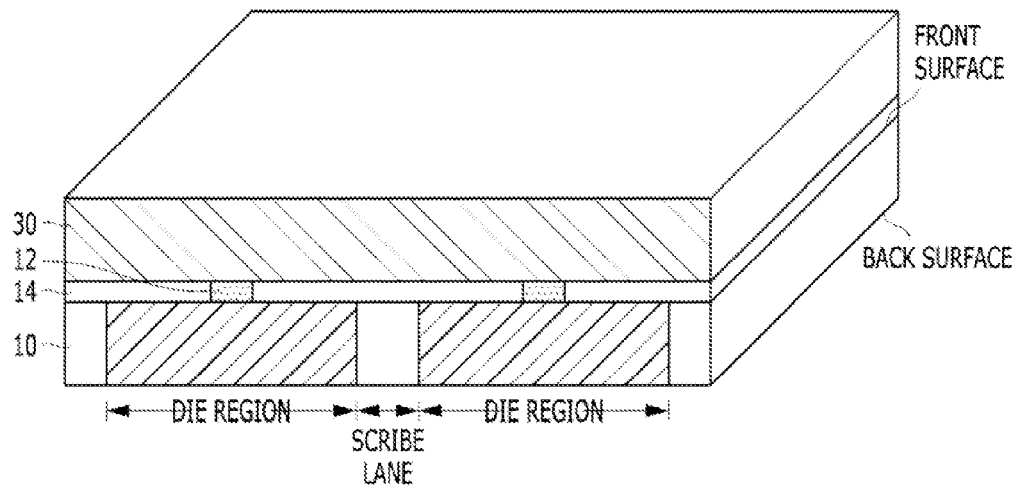

As shown in FIG. 4B, a sacrificial layer 14 filling between bonding patterns 12 is formed on the device wafer 10. The sacrificial layer 14 may have an upper surface which is flush with an upper surface of the bonding pattern 12. Thus, the sacrificial layer 14 may be formed by applying a material layer on the device wafer 10 to such a thickness sufficient to fill between the bonding patterns 12.

Then, a planarization process, e.g., a chemical mechanical process (CMP), is performed against the material layer until an upper surface of the bonding pattern 12 is exposed. The sacrificial layer 14 may be formed of material whose residue is easy to remove. It is preferable that the material have an etch selectivity to the bonding pattern 12. For example, when the bonding pattern 12 is formed of silicon nitride, the sacrificial layer 14 may be formed of carbon-containing material or silicon oxide.

Next, a carrier wafer 30 is prepared. The carrier wafer 30 may be single crystal material or include silicon-containing material. For example, the carrier wafer 30 may be a bulk silicon wafer.

Next, the carrier wafer 30 is bonded to the device wafer 10 where the bonding pattern 12 and the sacrificial layer 14 are formed. A wafer bonding process is performed so that the bonding pattern 12 is in contact with both of the device wafer 10 and the carrier wafer 30. The wafer bonding process may be performed by various conventional methods.

Figure 4C:
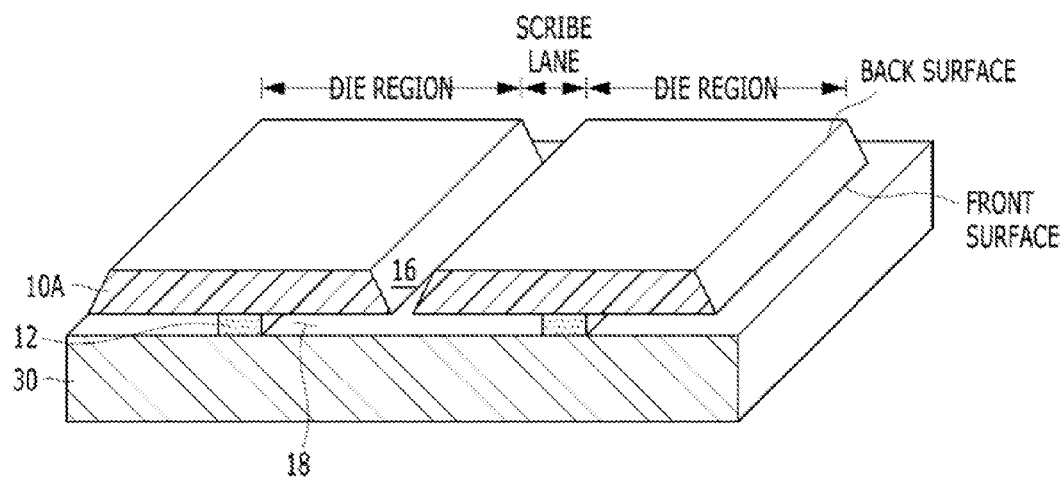

As shown in FIG. 4C, a thinning process is performed against the back side of the device wafer 10 to reduce the thickness of the device wafer 10. Even though not shown in drawings, color filters (not shown) and micro lenses (not shown) are formed on the back side of the device wafer 10 and arranged to correspond to the respective photoelectric conversion elements. Hereinafter, the device wafer 10 which is obtained upon completion of the thinning process is referred to as the numerical reference 10A.

Next, the scribe lane of the device wafer 10A is etched to form a trench 16, dividing the device wafer 10A into a plurality of die regions. The trench 16 may have an inclined sidewall. Accordingly, each die region has an inclined sidewall as well. Specifically, the width of the trench 16 may increase from the bottom to the top. The trench 16 may be formed by a dry etching process. The etching process to form the trench 16 may be performed until the sacrificial layer 14 is exposed or the carrier wafer 30 is exposed.

Next, the sacrificial layer 14 is removed. Upon removal of the sacrificial layer 14, a cavity 18 may be formed between the die region of the device wafer 10A and the carrier wafer 30. The sacrificial layer 14 may be removed by various methods depending on the material forming the sacrificial layer 14. For example, when the sacrificial layer 14 is formed of carbon-containing material, it may be removed by an ashing process. When it is formed of silicon oxide material, it may be removed, e.g., using a HF etchant.

In another embodiment for fabricating the curved image sensor, the wafer boding process may be performed without forming the sacrificial layer 14. In this case, an additional process for removing the sacrificial layer 14 is not necessary. Upon completion of the wafer bonding process, a cavity 18 is formed between the device wafer 10A and the carrier wafer 30.

Figure 4D:
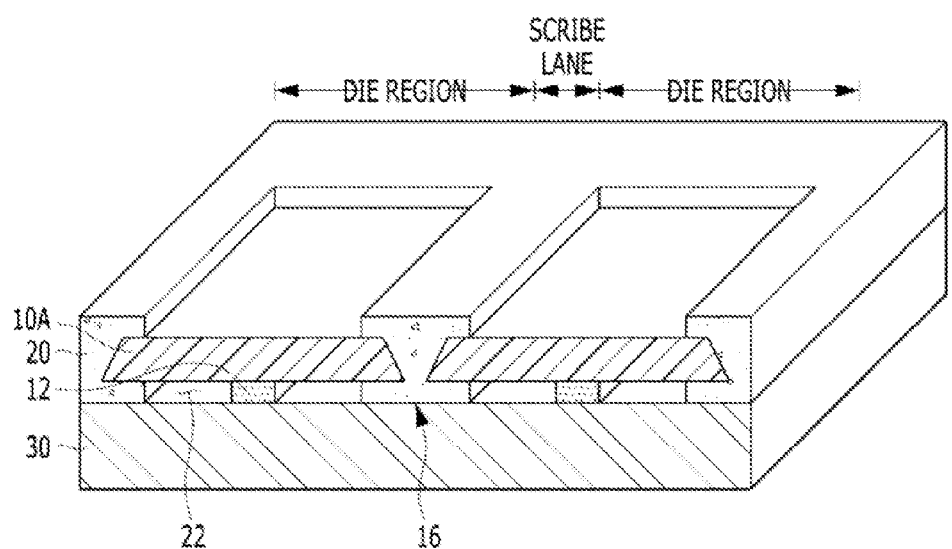

As shown in FIG. 4D, a fixing layer 20 filling the trench 16 is formed. By the fixing layer 20, the cavity 18 becomes a closed air cavity 22 which is isolated from outside. The fixing layer 20 filling the trench 16 may be in contact with a sidewall of each of the die regions.

To prevent the fixing layer 20 from completely filling the closed air cavity 22, the fixing layer 20 may be formed of a polymer with high viscosity. The polymer may be thermosetting material. When the fixing layer 20 is formed of a polymer with high viscosity, the polymer may extend under the trench 16 to be in contact with the carrier wafer 30 and the front side of the periphery of the die region.

Due to high viscosity of the polymer and the inclined sidewall of the die region, the fixing layer 20 is prevented from extending to the bonding pattern 12. That is, the fixing layer 20 is prevented from completely filling the closed air cavity 22. In addition, the fixing layer may protrude from the trench 16 and may be in contact with the backside of the periphery of the die region. As a result, the fixing layer 20 may be formed over the carrier wafer 30 and surround the periphery of each of the die regions of the device wafer 10A. As a result, the fixing layer 20 may be in contact with the front side, the sidewall, and the back side of the periphery of each of the die regions of the device wafer 10A. In an embodiment, the periphery of the die region may be stuck in the fixing layer 20.

Next, annealing is performed against the fixing layer 20. By annealing, mechanical strength of the dies 40 increases enough to endure a subsequent sawing process. However, the annealing process is to stop before the fixing layer 20 is completely hardened.

Figure 4E:
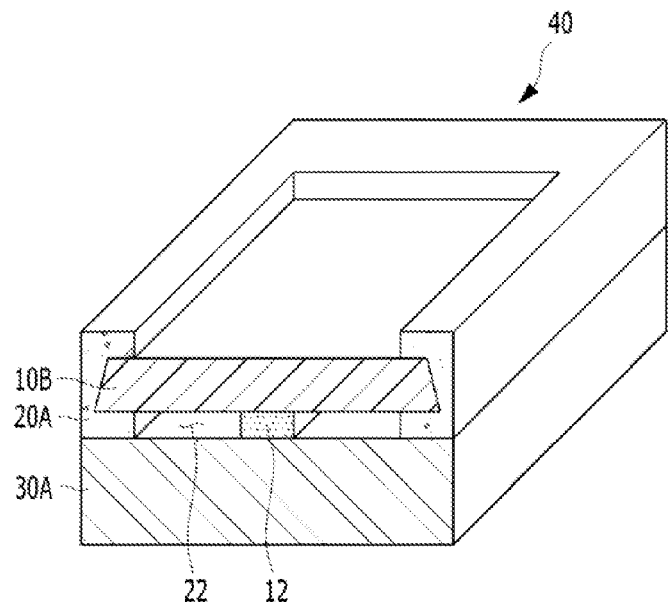

As shown in FIG. 4E, the sawing process is performed along the scribe lane to separate the dies 40 from each other. The fixing layer 20 and the carrier wafer 30 are sawed. Hereinafter, the carrier wafer 30 and the device wafer 10A which are singularized by the sawing process are referred to as a supporting substrate 30A and a sensing substrate 10B, respectively. The fixing layer 20 which is singularized by the sawing process is denoted with the reference numeral 20A.

Each die 40 singularized by the sawing process may include the supporting substrate 30A, the bonding pattern 12 formed over the supporting substrate 30A, the sensing substrate 10B provided over the supporting substrate 30A and in contact with the bonding pattern 12, and the fixing layer 20A provided over the supporting substrate 30A and surrounding the periphery of the sensing substrate 10B. The sensing substrate 10B of each die 40, which is obtained upon completion of the sawing process, has a flat light receiving surface. The closed air cavity 22 is formed by the supporting substrate 30A, the sensing substrate 10B, and the fixing layer 20A. The inside of the closed air cavity 22 has the same pressure as the outside. Before the sawing process, a thinning process may be performed against the carrier wafer 30.

Figure 4F:
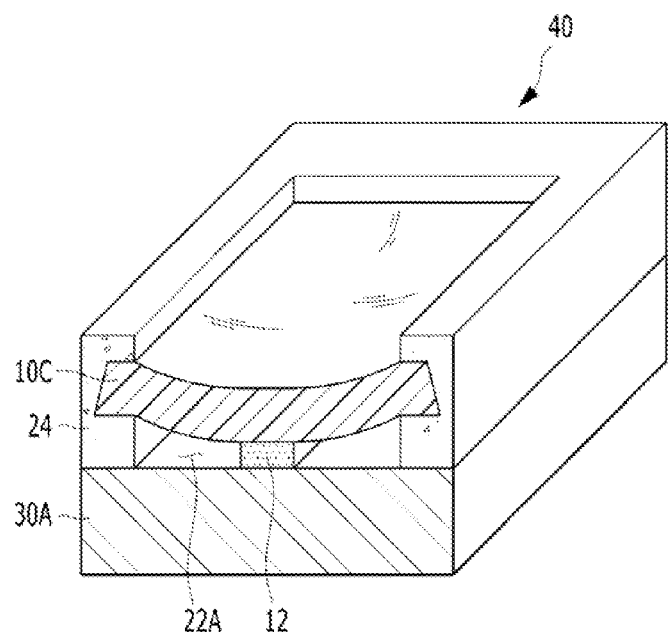

As shown in FIG. 4F, the die 40 is loaded in a chamber and annealing is performed, making the surface of the die 40 curved. At the same time, a fixing pattern 24 is formed to hold and maintain the curved surface. The curved surface may serve as a light receiving surface. Hereinafter, the sensing substrate 10B with the curved light receiving surface is denoted with the reference number 10C. The closed air cavity 22 formed in the die 40 and having the curved surface is denoted with the reference numeral 22A.

As the annealing is performed, air in the closed air cavity 22A expands. When air inside the closed air cavity 22A expands with the center of the sensing substrate 10C bonded to the supporting substrate 30A by the bonding pattern 12, the periphery of the sensing substrate 10C expands/inflates and the light receiving surface becomes curved. The annealing may be performed until the fixing layer 20A, which has thermosetting properties, transforms its shape. As the periphery of the sensing substrate 10C expands, the shape (especially the height) of the fixing layer 20A, which is in contact with the periphery of the sensing substrate 10C, changes. That is, the fixing layer 20A transforms into the fixing pattern 24. The fixing pattern 24 may be formed higher than the fixing layer 20A.

Upon completion of the annealing process, thermosetting properties of the fixing pattern 24 may maintain their transformed shape, regardless changes in outside temperature. Thus, the curved light receiving surface may be maintained. Since air in the closed air cavity 22A expands, the air pressure inside the closed air cavity 22A may lower than the external air pressure and the light receiving surface may remain curved. According to the processes described above, a curved image sensor according to an embodiment may be fabricated. Then, a conventional packaging process is performed to produce a device or a module including a curved image sensor.

As described above, according to a method for fabricating the curved image sensor, all processes are completed at a wafer level before the packaging process, thereby improving productivity. In addition, the size (especially, height/thickness) of a package including the curved image sensor may be effectively reduced.

The curved image sensor according to an embodiment may be employed in various electronic devices or systems. Hereinafter, a camera employing the curved image sensor will be described in reference to FIG. 5.

Figure 5:
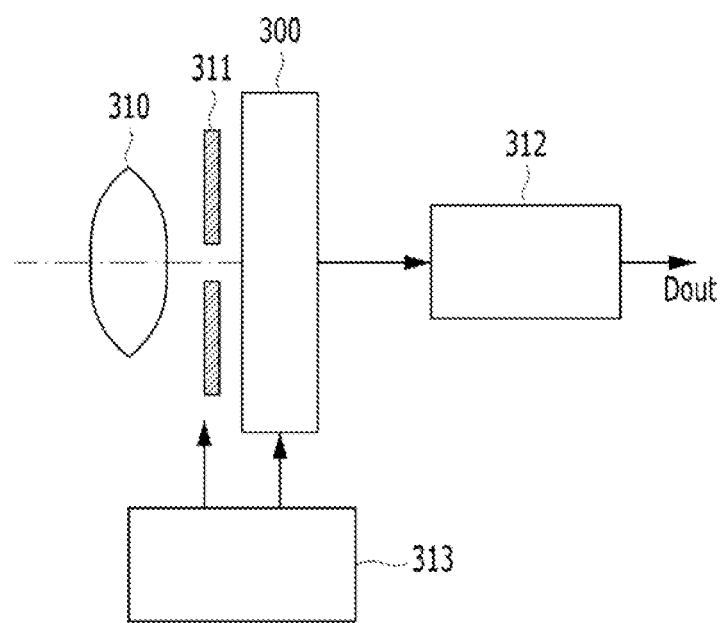
FIG. 5 shows an electronic device including a curved image sensor according to an embodiment of the present invention.

FIG. 5 shows an electronic device including a curved image sensor according to an embodiment of the present invention. Referring to FIG. 5, an electronic device with a curved image sensor according to an embodiment may be a camera. The camera may take a still picture or a moving picture. The electronic device may include a curved image sensor 300, an optical system (or an optical lens) 310, a shutter unit 311, a driving unit 313 for controlling and driving the curved image sensor 300 and the shutter unit 311, and a signal processing unit 312.

The optical system 310 guides an image of an object (incident light) to the pixel array 2 (see FIG. 1) of the curved image sensor 300. The optical system 310 may include a plurality of optical lenses. The shutter unit 311 controls emitting and blocking of incident light. The driving unit 313 controls transmission operations of the curved image sensor 300 and shutter operations of the shutter unit 311. The signal processing unit 312 processes image signals outputted from the curved image sensor 300. The processed image signal may either be stored in a memory or outputted to a monitor.

Although various embodiments have been described for Illustrative purposes, it will be apparent to those skilled in the art that various changes and modifications may be made without departing from the spirit and scope of the invention as defined in the following claims.

What is claimed is:

1. A curved image sensor comprising:
    a supporting substrate;
    a bonding pattern provided over the supporting substrate;
    a sensing substrate provided over the supporting substrate and in contact with the bonding pattern, and having a curved surface receiving incident light; and
    a fixing pattern provided over the supporting substrate and surrounding a periphery of the sensing substrate,
    wherein the bonding pattern serves as an adhesive member for bonding the sensing substrate and the supporting substrate, and is in contact with a center of the sensing substrate,
    wherein a side wall of the sensing substrate is entirely surrounded and fixed by the fixing pattern, and
    wherein the fixing pattern has a different material from the supporting substrate.

2. The curved image sensor of claim 1, further comprising:
    a closed air cavity enclosed by the sensing substrate, the supporting substrate, and the fixing pattern,
    wherein the closed air cavity has a lower pressure than outside of the curved image sensor.

3. The curved image sensor of claim 1,
    wherein the sensing substrate includes a device wafer, and
    wherein the supporting substrate includes a carrier wafer.

4. The curved image sensor of claim 1, wherein the size of the bonding pattern is 10-20% of the size of the sensing substrate.

5. The curved image sensor of claim 1, wherein a width-length ratio of the bonding pattern is approximately the same as a width-length ratio of the sensing substrate.

6. The curved image sensor of claim 1, wherein the fixing pattern is in contact with a sidewall of the sensing substrate.

7. The curved image sensor of claim 1, wherein the sensing substrate has an inclined sidewall.

8. The curved image sensor of claim 1, wherein the fixing pattern has a donut shape.

9. The curved image sensor of claim 1, wherein the fixing pattern includes thermosetting material.

10. The curved image sensor of claim 1, further comprising:
    a logic circuit layer provided over the supporting substrate and in contact with the bonding pattern and the fixing pattern; and
    a plurality of connectors passing through the fixing pattern and suitable for electrically connecting the sensing substrate to the logic circuit layer.

11. An electronic device, comprising:
    an optical system;
    a curved image sensor suitable for receiving light from the optical system; and
    a signal processing element suitable for processing a signal outputted from the curved image sensor,
    wherein the curved image sensor includes:
    a supporting substrate;
    a bonding pattern provided over the supporting substrate;
    a sensing substrate provided over the supporting substrate and in contact with the bonding pattern, and having a curved surface receiving incident light; and
    a fixing pattern provided over the supporting substrate and surrounding a periphery of the sensing substrate, wherein the bonding pattern serves as an adhesive member for bonding the sensing substrate and the supporting substrate, and is in contact with a center of the sensing substrate, wherein a side wall of the sensing substrate is entirely surrounded and fixed by the fixing pattern, and wherein the fixing pattern has a different material from the supporting substrate.

12. The electronic device of claim 11, further comprising:

a logic circuit layer provided over the supporting substrate and in contact with the bonding pattern and the fixing pattern; and a plurality of connectors passing through the fixing pattern and suitable for electrically connecting the sensing substrate to the logic circuit layer.

* * * * *